SERIES RESONANT CIRCUIT FOR COUPLING OUTPUT OF MIXER TO INPUT OF INTERMEDIATE FREQUENCY AMPLIFIER
Filed Jan. 12, 1966
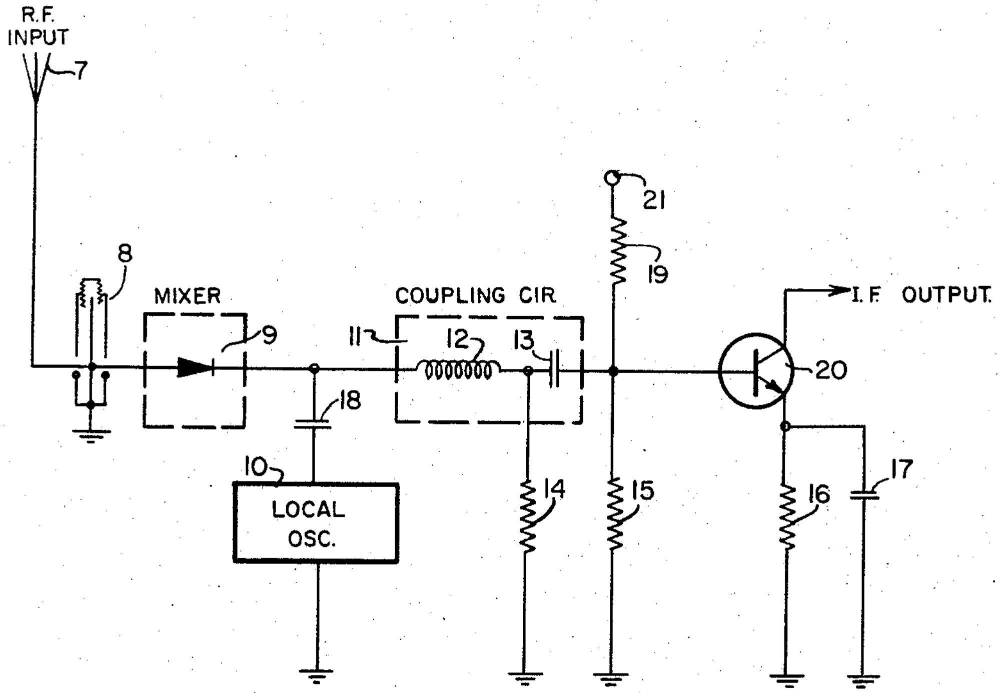
INVENTOR
FRANK L. PAWLOWSKI
BY
Mueller, Aichele and Rauner
ATTYS.

United States Patent Office 3,437,934
Patented Apr. 8, 1969

3,437,934

SERIES RESONANT CIRCUIT FOR COUPLING OUTPUT OF MIXER TO INPUT OF INTERMEDIATE FREQUENCY AMPLIFIER

Frank L. Pawlowski, Skokie, Ill., assignor to Motorola, Inc., Franklin Park, Ill., a corporation of Illinois Filed Jan. 12, 1966, Ser. No. 520,257
Int. Cl. H04b *1/26*
U.S. Cl. 325—439 5 Claims

ABSTRACT OF THE DISCLOSURE

Coupling circuit for coupling output of diode mixer to base electrode of transistor of intermediate frequency amplifier, comprising an inductor and a capacitor connected in series and forming a series resonant circuit at the intermediate frequency. The junction between the inductor and capacitor is connected to ground by a resistor which damps the circuit and provides a direct current return for the mixer. The inductor acts to keep the oscillator frequency from the amplifier, and the capacitor isolates the mixer from the bias voltage at the base of the transistor.

The present invention relates generally to passive coupling circuits, and more particularly to a coupling network especially adapted to provide interstage coupling in a ratio receiver between the output of a mixer and the input of an intermediate frequency (IF) amplifier.

Heretofore, the above type of coupling was usually accomplished using parallel resonant circuits in a network which required, in addition to the inductor and capacitor forming the parallel tuned circuit, a direct current (DC) separator capacitor to prevent IF amplifier bias voltages from reaching the mixer circuit, and a radio frequency (RF) choke to keep local oscillations out of the IF stage. In addition, the tuning of these parallel LC coupling circuits is often critical.

An object of the invention is to provide an improved coupling network particularly adapted for coupling the output ot a mixer stage to the input of an IF amplifier.

Another object of the invention is to provide an improved coupling circuit of the type described that requires a minimum of passive components, while at the same time providing excellent receiver sensitivity.

A further object of the invention is to provide a coupling network which does not have to be tuned once the component values therefor have been selected.

The coupling circuit according to the present invention requires only a single inductor and a single capacitor connetced in series between a mixer stage and an IF amplifier stage, and tuned to form a series resonant circuit at the IF frequency. A resistor is connected from the junction between the indutcor and capacitor to ground, and the inductor and the resistor provide a DC return for the mixer. The inductor also acts to keep the oscillator frequency from the amplifier, and the capacitor isolates the mixer from the bias supply for the amplifier.

The invention is shown in the accompanying drawing wherein the single figure is a schematic diagram showing the use of the coupling circuit in a receiver.

As shown by the circuit on the drawing, RF signals are picked up by an antenna 7 and coupled through a preselector cavity 8 to the anode of diode mixer 9. Local oscillations are applied from the local oscillator 10 through coupling capacitor 18 to the cathode of diode mixer 9. The selector cavity 8 serves the additional function of providing a DC return to ground for the diode mixer 9. Although the antenna 7 is illustrated as the source of signals, it is pointed out that the mixer coupling circuit can be used with a different source of signals. Also, when used in a receiver, the input to the mixer coupling circuit may include one or more RF amplifier and/or frequency conversion stages.

The IF signal at the output of diode 9, which includes the difference frequency signal between the RF and local oscillator frequencies, is connected through the series resonant coupling circuit 11 to the control or base electrode of a transistor 20 which forms an IF amplifier. A pair of transistor bias resistors 15 and 19 are connected to the base electrode of transistor 20, and a positive voltage supply is connected at terminal 21 to resistor 19. The emitter of transistor 20 is DC connected to ground through resistor 16, which is bypassed by capacitor 17. The IF output is taken from the transistor collector.

The values of the inductor 12 and capacitor 13 in the coupling circuit 11 are selected to resonate at the IF frequency, and the coil 12 and resistor 14 provide a DC return path for the diode mixer 9. In addition to being a necessary element in the series resonant coupling circuit, and porviding this DC return path, the coil 12 also serves as an RF choke to prevent short circuiting of the local oscillator output and to keep the oscillator frequencies out of the IF amplifier stage. The capacitor 13, in addition to being an essential element in the series resonant circuit, provides DC separation between the mixer stage and the bias supply voltage for the IF amplifier 20.

In one circuit embodiment, the coupling circuit 11 is used with a mixer which provides an IF frequency of 12 megacycles. The bandwidth of the coupling circuit is $\pm 5\%$ of the 12 megacycle frequency to which it is resonated, for a total bandwidth of 1.2 megacycles. This wide bandwidth is made possible because of the low Q of the series circuit 11, due in part to the action of resistor 14. In the embodiment mentioned, the value of choke coil 12 has been selected as .32 microhenrie, and the resistor 14 has a value of 680 ohms, and these values provide the necessary bandwidth while providing high coupling efficiency. The main selectivity of the receiver at the IF frequency is provided by circuits following the transistor 20. There is no noticeable degradation in the performance of the coupling circuit by having a Q which will give a bandwidth equal to $\pm 5\%$ of the series circuit resonant frequency.

The following table includes component values for the circuit embodiment referred to above, which has been built according to the teachings of the present invention. However, these values are not to be construed as limiting the scope of the invention.

TABLE

| | | |
|---|---|---|
| RF frequency | megacycles | 450 |
| Local oscillator frequency | do | 438 |
| IF frequency | do | 12 |
| Inductor **12** | microhenries | [1] 0.31 |
| Capacitor **13** | picofarads | [1] 650 |
| Resistor **14** | ohms | 680 |
| Resistor **15** | kilohms | 27 |
| Resistor **16** | do | 3.3 |
| Capacitor **17** | microfarads | 0.01 |
| Capacitor **18** | picofarads | 1.5 |
| Resistor **19** | kilohms | 12 |
| Transistor **20** | | NPN |

[1] $\pm 5$ perent.

The coupling circuit described above has been found to operate more efficiently than a parallel LC resonant circuit in coupling a mixer stage to a transistor amplifier. When the coil 12 and capacitor 13 are selected to resonate at the desired IF frequency, further adjustments are unnecessary when components having normal tolerances are used. By using the components to provide multiple functions as described, the desired action is accomplished by an extremely simple circuit.

I claim:

1. In electronic equipment wherein a radio frequency signal and a local oscillator signal are applied to a mixer to produce at the output thereof an intermediate frequency signal, and the intermediate frequency signal from the mixer is coupled to the base electrode of a transistor of an intermediate frequency amplifier, the coupling circuit including in combination, an inductor connected directly to the output of the mixer, a capacitor connected directly between said inductor and the base electrode and together with said inductor forming a series circuit resonant at the intermediate frequency, said inductor and said capacitor being the sole series connected components between the mixer and the base electrode, a resistor connected between the junction of said capacitor and a point of reference potential and providing a direct current return path for said mixer, and means applying a direct current bias voltage to the base electrode of the transistor, said inductor further serving as a choke coil to keep the local oscillator signal out of the intermediate frequency amplifier, and said capacitor further serving as a direct current isolator to prevent the bias voltage applied to the base electrode from reaching the mixer.

2. A radio receiver including in combination, a mixer having input means for receiving radio frequency signals and local oscillations and having an output for providing an intermediate frequency signal, an intermediate frequency amplifier having an input electrode, means applying a direct current bias voltage to said input electrode, an inductor having first and second terminals, with said first terminal connected directly to the output of said mixer, a capacitor having first and second terminals, with said first terminal connected directly to said second terminal of said inductor and said second terminal connected directly to said input electrode of said intermediate frequency amplifier, said inductor and said capacitor forming a series circuit resonant at the intermediate frequency and being the sole series connected components between said mixer and said input electrode of said amplifier, a resistor connected from said second terminal of said inductor to a point of reference potential to provide a DC return path for said mixer, said inductor further serving as a choke coil to present a high impedance to local oscillations to keep such oscillations from reaching said intermediate frequency amplifier, and said capacitor further serving as the DC isolator to prevent the bias voltage at said input electrode of said amplifier from reaching said mixer.

3. A radio receiver according to claim 2, wherein said intermediate frequency amplifier includes a transistor having base, emitter and collector electrodes, and said base electrode forms the input electrode of said amplifier.

4. A radio receiver according to claim 2, wherein said mixer is a diode connected to receive a radio frequency signal at one electrode thereof and connected to receive said local oscillations at the second electrode thereof, with said second electrode forming said output of said mixer.

5. A radio receiver according to claim 2 wherein said inductor, said capacitor and said resistor have values such that said series circuit has a bandwidth of the order of $\pm 5\%$ of the intermediate frequency output of said mixer.

References Cited

UNITED STATES PATENTS

| | | | |
|---|---|---|---|
| 1,850,831 | 3/1932 | Elliott | 325—380 |
| 2,252,609 | 8/1941 | Beck | 325—489 |
| 2,653,228 | 9/1953 | Pan | 325—436 |
| 2,778,934 | 1/1957 | Tongue | 325—449 XR |
| 2,773,979 | 12/1956 | Chatterdon et al. | 325—449 |
| 2,803,745 | 8/1957 | Pan et al. | 325—449 XR |

WILLIAM C. COOPER, *Primary Examiner.*

R. S. BELL, *Assistant Examiner.*

U.S. Cl. X.R.

330—31; 331—74